(12) United States Patent
Herriot

(10) Patent No.: US 10,794,704 B2
(45) Date of Patent: Oct. 6, 2020

(54) SYSTEMS AND METHODS FOR CONTINUOUS REPLANNING OF VEHICLE TRAJECTORIES

(71) Applicant: SMARTSKY NETWORKS LLC, Morrisville, NC (US)

(72) Inventor: James W. Herriot, Palo Alto, CA (US)

(73) Assignee: SMARTSKY NETWORKS LLC, Morrisville, NC (US)

(*) Notice: Subject to any disclaimer, the term of this patent is extended or adjusted under 35 U.S.C. 154(b) by 60 days.

(21) Appl. No.: 16/267,921

(22) Filed: Feb. 5, 2019

(65) Prior Publication Data
US 2019/0170515 A1 Jun. 6, 2019

Related U.S. Application Data

(63) Continuation of application No. 15/234,602, filed on Aug. 11, 2016, now Pat. No. 10,240,926, which is a continuation of application No. 13/999,899, filed on Apr. 1, 2014, now Pat. No. 9,417,070.

(60) Provisional application No. 61/853,391, filed on Apr. 1, 2013, provisional application No. 61/806,969, filed on Apr. 1, 2013.

(51) Int. Cl.
| | |
|---|---|
| G01C 21/00 | (2006.01) |
| G08G 5/00 | (2006.01) |
| G08G 5/04 | (2006.01) |
| G06F 30/20 | (2020.01) |

(52) U.S. Cl.
CPC .......... *G01C 21/00* (2013.01); *G06F 30/20* (2020.01); *G08G 5/0034* (2013.01); *G08G 5/0039* (2013.01); *G08G 5/0069* (2013.01); *G08G 5/0078* (2013.01); *G08G 5/0082* (2013.01); *G08G 5/045* (2013.01)

(58) Field of Classification Search
CPC ...... G01C 21/00; G06F 30/20; G08G 5/0034; G08G 5/0039; G08G 5/0069; G08G 5/0078; G08G 5/0082; G08G 5/045
See application file for complete search history.

(56) References Cited

U.S. PATENT DOCUMENTS

| | | | |
|---|---|---|---|
| 4,021,009 A | 5/1977 | Baker et al. | |
| 5,415,549 A | 5/1995 | Logg | |
| 5,548,515 A * | 8/1996 | Pilley | G01C 23/00 340/961 |

(Continued)

OTHER PUBLICATIONS 8 tips to make you a formatting pro: chandoo.org available at http://chandoo.org/wp/2011/12/05/excel-formatting-tips/, all enclosed pages cited, 3 pages.

*Primary Examiner* — Behrang Badii
*Assistant Examiner* — Daniel L Greene
(74) *Attorney, Agent, or Firm* — Burr & Forman, LLP

(57) ABSTRACT

A method and system for continuously re-planning a vehicle's path, in the face of stationary and moving obstacles, dynamically calculates a new path in real time which is both efficient and maintains minimum safety clearances relative to obstacles. Repulsion signals emanating from obstacles and propagating through delineated sections of a grid representing a geographic space are summed along with values representing the relative distance of the sections from the vehicle origin and vehicle destination. The grid sections having optimal values according to a predetermined criteria represent an efficient and safe travel path between the vehicle origin and destination.

20 Claims, 12 Drawing Sheets

(56) References Cited

U.S. PATENT DOCUMENTS

| | | | |
|---|---|---|---|
| 5,581,259 A | 12/1996 | Schipper | |
| 5,988,645 A | 11/1999 | Downing | |
| 6,138,060 A | 10/2000 | Conner et al. | |
| 6,266,610 B1* | 7/2001 | Schultz | G01C 21/20 |
| | | | 701/528 |
| 6,421,603 B1* | 7/2002 | Pratt | G01C 21/00 |
| | | | 244/175 |
| 6,456,226 B1 | 9/2002 | Zheng et al. | |
| 6,469,664 B1 | 10/2002 | Michaelson et al. | |
| 6,734,808 B1 | 5/2004 | Michaelson et al. | |
| 6,842,746 B1 | 1/2005 | Kauffman et al. | |
| 7,940,259 B2* | 5/2011 | Wright | G08G 5/0095 |
| | | | 345/418 |
| 8,554,458 B2 | 10/2013 | Sawhill et al. | |
| 8,594,917 B2 | 11/2013 | Sawhill et al. | |
| 9,171,475 B2* | 10/2015 | Peinecke | G08G 5/045 |
| 9,679,410 B1* | 6/2017 | Saal | G06T 17/00 |
| 2001/0023390 A1* | 9/2001 | Gia | G01S 13/935 |
| | | | 701/301 |
| 2003/0019931 A1 | 1/2003 | Tsikos et al. | |
| 2009/0150012 A1 | 6/2009 | Agam et al. | |
| 2012/0065881 A1* | 3/2012 | McIver | G05D 1/0088 |
| | | | 701/467 |
| 2012/0314032 A1 | 12/2012 | Muensterer et al. | |
| 2013/0317731 A1 | 11/2013 | Scott | |

\* cited by examiner

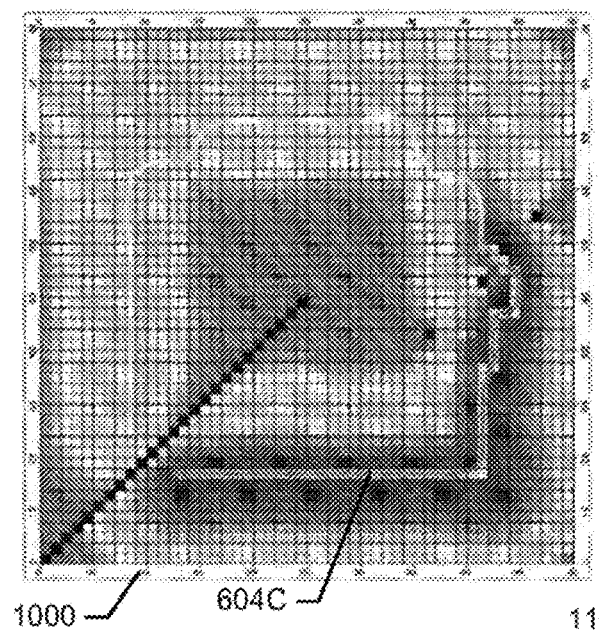
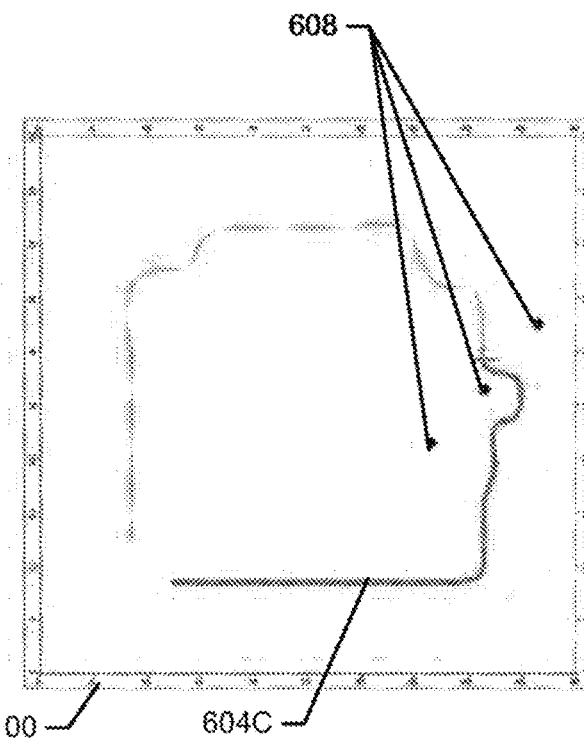
Figure 10
Figure 11

SYSTEMS AND METHODS FOR CONTINUOUS REPLANNING OF VEHICLE TRAJECTORIES

CROSS-REFERENCE TO RELATED APPLICATIONS

This application is a continuation of U.S. application Ser. No. 15/234,602 filed Aug. 11, 2016, which is a continuation of U.S. application Ser. No. 13/999,899, filed Apr. 1, 2014 (which issued on Aug. 16, 2016 as U.S. Pat. No. 9,417,070), entitled, "SYSTEMS AND METHODS FOR CONTINUOUS REPLANNING OF VEHICLE TRAJECTORIES," which in turn claims priority to U.S. Provisional Application Nos. 61/853,391 and 61/806,969 both filed on Apr. 1, 2013, all of which are incorporated herein by reference in their entirety for all purposes.

COMPUTER PROGRAM LISTING APPENDIX

A Computer Program Listing Appendix, comprising a single file "Source Code Appendix 44278.00108 4824-2570-4218.txt" of 46 Kbytes, is incorporated herein by this reference for all purposes, such appendix listing an exemplary source code implementation.

BACKGROUND OF THE INVENTION

A typical mission for a vehicle, particularly in aircraft, is to fly from a specified origin to a specified destination possibly by way of one or more specific waypoints, typically for two is a flight plan. Problems arise when there are obstacles which must be safely and reliably avoided and some minimum separation distance maintained between obstacles and or other vehicles as they pass relative to one another. This problem becomes more difficult when obstacles are moving, i.e. other vehicles or aircraft. In such instance in aircraft must continually monitor for other obstacles and dynamically re-compute its flight path accordingly. Such problem becomes more acute with the dawning of mixed used airspace in which airspace is shared by both piloted and unpiloted aircraft, i.e., unmanned aerial vehicles (UAVs).

Accordingly, a need exists for a system and technique by which a piloted or unpiloted vehicle may avoid obstacles or other vehicles at a safe distance.

A further need exists for a system and technique by which piloted or unpiloted vehicles may have their respective paths or trajectories dynamically recomputed in real time to avoid both stationary and moving obstacles, such as other vehicles.

SUMMARY OF THE INVENTION

Disclosed herein are method, systems and algorithms for continuously re-planning a vehicle's trajectory or path in the face of continually changing conditions, including obstacles and/or other moving vehicles. More specifically, disclosed herein is a technique for safely avoiding other vehicles and/or obstacles by dynamically calculating a new path in real time. As contemplated herein, a vehicle may be any of an aircraft, sea or land vehicle. For purposes of illustration, aircraft will be utilized to illustrate the disclosed system and techniques.

In accordance with one aspect, a method for planning a path of a vehicle through an area comprises: A) modeling, within a computer memory, a selected area as a plurality of sub-areas, selected of the sub-areas having a flight object associated therewith; B) associating with each of the plurality of sub-areas one or more parameters, at least one of the parameters representing a summation value; C) modifying the summation value associated with each of the plurality of sub-areas in relation to a proximity of sub-area having a flight object associated therewith; D) determining one or more sub-areas having a summation value satisfying a predetermined rule; and E) identifying adjacent of the sub-areas satisfying the predetermined role as representing the path of the vehicle through the area.

In accordance with one aspect, a system for planning a path of a vehicle through an area comprises; A) program logic configured for modeling, within a computer memory, a selected area as a plurality of sub-areas, selected of the sub-areas having a flight object associated therewith; B) program logic configured for associating with each of the plurality of sub-areas one or more parameters, at least one of the parameters representing a summation value; C) program logic configured for modifying the summation value associated with each of the plurality of sub-areas in relation to a proximity of sub-area having a flight object associated therewith; D) program logic configured for determining one or more sub-areas having a summation value satisfying a predetermined rule; and E) program logic configured for identifying adjacent of the sub-areas satisfying the predetermined role as representing the path of the vehicle through the area.

According to another aspect of the disclosure, A method for planning a path of a vehicle through an area comprises: A) modeling, within a computer memory, an area having at least one flight object contained therein; B) defining a sub-area of the area and a summation parameter associated therewith; C) modifying a value for the summation parameter in accordance with a relative distance of the sub-area to each of the flight objects contained within the area; and D) determining if the value of the summation parameter of the sub-area satisfies a predetermined rule.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The present disclosure will be more completely understood through the following description, which should be read in conjunction with the drawings in which:

FIG. 10 illustrates conceptually the grid of FIG. 8 with a second re-computed flight plan to avoid a second set of moving obstacles, the second re-computed flight plan fitted with a set of cubic splines overlaid in purple in accordance with the disclosure;

FIG. 11 illustrates conceptually, the grid of FIG. 10, without the grid the graphics, and with the re-computed flight plan overlaid in purple and further illustrating how the dynamically generated, second recomputed flight path avoids the second set of moving obstacles, i.e. the black dots, and leaving its history behind, as illustrated in blue, in accordance with the disclosure;

DETAILED DESCRIPTION

The method, technology, and algorithms disclosed herein may be implemented in all software and executed on a data processing hardware system having a standard processor and memory architecture as well as, possibly, access to a database containing data sets representing historical air traffic and/or a network connection for receiving real-time flight data representing one or more aircraft.

The system and methods disclosed herein utilize a representation of an aircraft within an airspace with a multi dimensional data structure representing the X, Y and Z coordinates of the vehicle within an airspace and two different types of time, "now" time when the current computation is being carried out, and, "future" time relative to the now moment which is used to represent the current planned trajectory into the future. Systems utilizing trajectory recalculation with five parameters is disclosed in commonly assigned U.S. Pat. No. 8,554,458, entitled System And Method For Planning, Disruption Management, And Optimization Of Networked, Scheduled Or On-Demand Air Transport Fleet Trajectory Operations, and U.S. Pat. No. 8,594,917 entitled Method And Apparatus For Dynamic Aircraft Trajectory Management, the subject matters of which are incorporated herein by this reference for all purposes.

In the illustrative embodiment, only the x and y coordinates within the airspace will be utilized to simplify the explanation, with the z coordinate, representing the altitude of the aircraft, being easily and consistently added. Since flight plans include a future time, future time will be implied with the 2-D flight paths illustrated in the Figures since it is inherent that it would take time to fly the flight path in its current form. In addition, the "now" time is represented by the current position of an aircraft along its projected flight path, as illustrated in FIGS. 7-11. Accordingly, although the illustrative description herein, specifically as illustrated conceptually in the figures, appears two-dimensional, the technique is applicable to three or more dimensions in light of the description contained herein.

Figure 1:
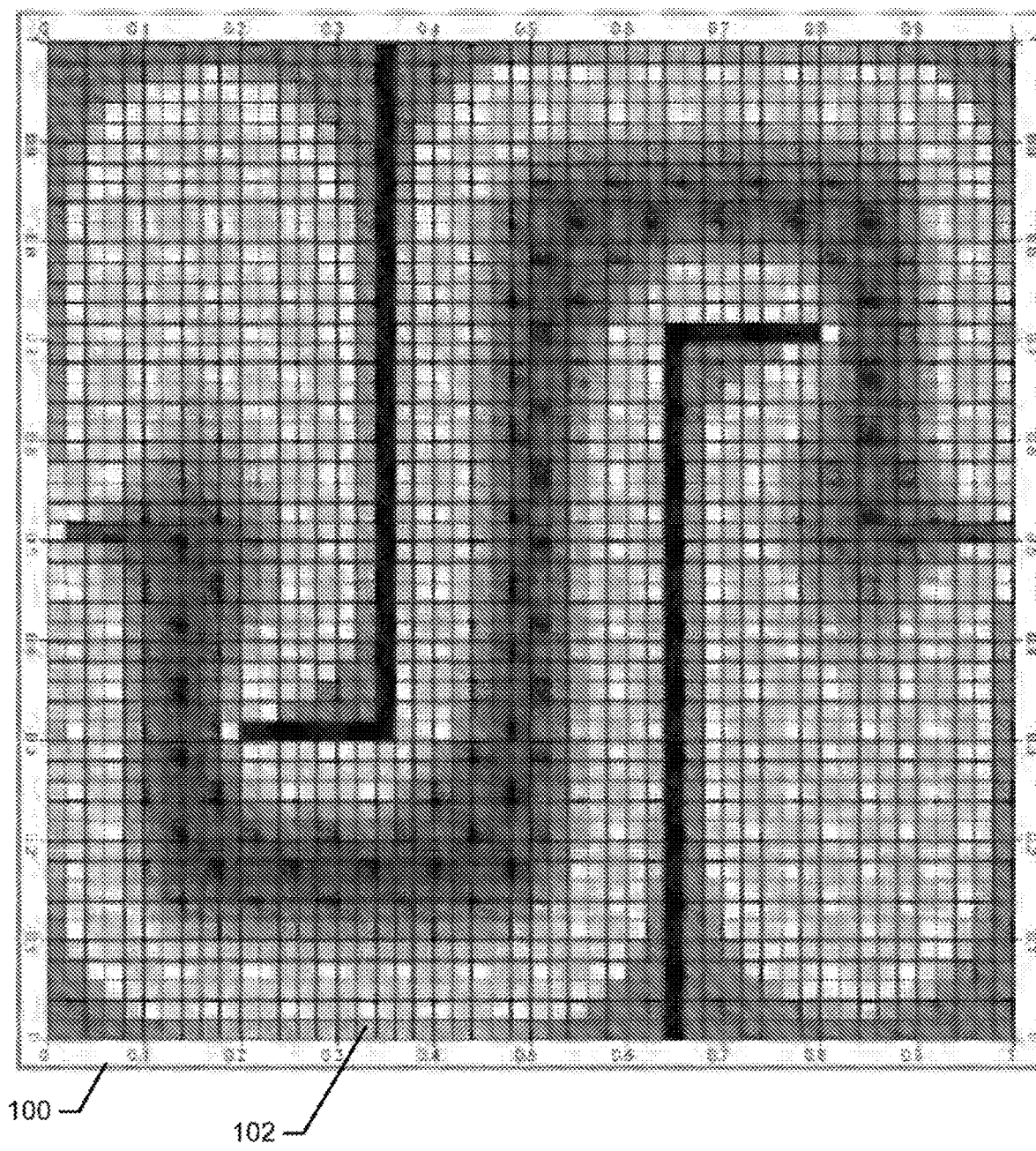
FIG. 1 illustrates conceptually an exemplary grid heat map, with an optimal flight path at bottom of (blue) 'canyon' in accordance with the disclosure.

In accordance with an illustrative embodiment, the airspace through which an aircraft will navigate is represented as an area which may be divided into a plurality of sub areas. In the illustrative embodiment, the area representing the airspace in question is shown as a grid 100 divided into a plurality of grid tiles 102, as illustrated in FIG. 1. The granularity of the grid may be small enough to account for resolution needed for aircraft (or other vehicle) separation, but large enough to minimize computation cycles. For example, for the region geographically representing the contiguous 48 states of the United States, the region may be divided into a multitude of grid tiles for the continental United States. Other regions, representing either smaller or larger areas, may be described by a different number of grid tiles. For illustrative purposes the conceptual grid representing the airspace is rectangular in shape with the individual grid tiles being substantially rectangular in shape. Note that alternative shapes and sizes of tiles representing sub-areas of a greater area or grid may be used with the system and techniques disclosed, resulting in different numbers of units. Further, the disclosed system and method may be applied globally to any geographical region or space.

Referring again to FIG. 1, the grid 100 is color-coded to form a heat map the colors of which indicate the safest most efficient path for the vehicle through the grid space. In FIG. 1, obstacles, as illustrated by black walls, propagate 'hot' (red) repulsion, which attenuates down to 'cold' (blue) farther away from, i.e. a safe distance away from, the walls representing the obstacles. The preferred flight path is thus the bottom of the (blue) 'canyon' far from walls of the labyrinth which has been dynamically generated using the method technique described herein.

Figure 13A:
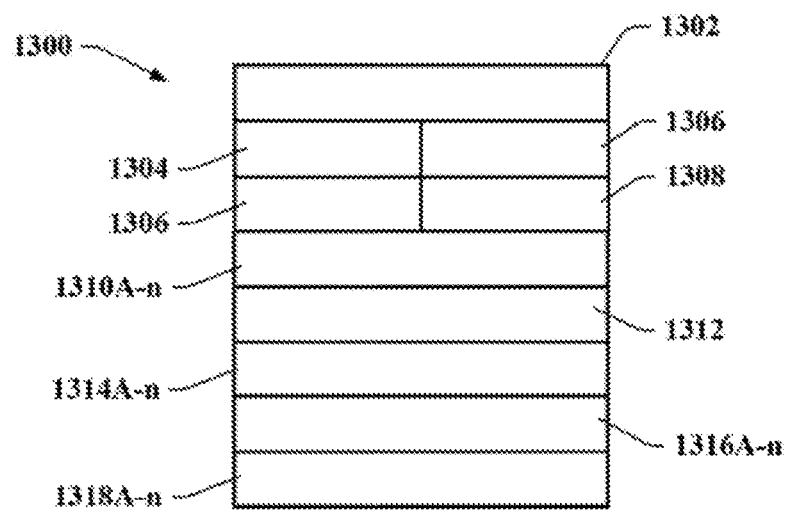
FIGS. 13A-B illustrates conceptually data structures used to represent the main area in sub-areas, respectively, in accordance with the disclosure.
Figure 13B:
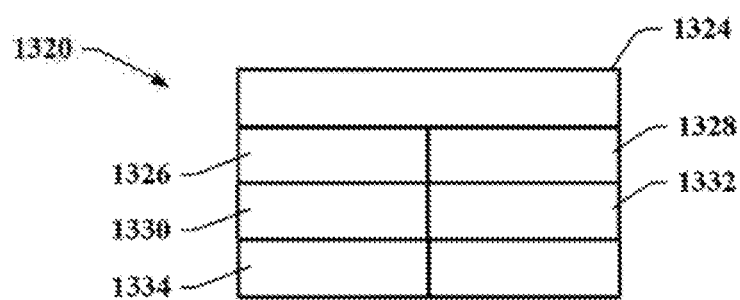

In accordance with the disclosure, the area represented by grid 100, has an associated data object or data structure 1300 having various data parameters useful in describing the flight path of the Primary Aircraft within the context of the area mode/represented by grid 100. As illustrated in FIG. 13A, data structure 1300, may comprise one or more data parameters useful in globally defining the grid 100 including, but not limited to any of a grid identifier 1302, geographic reference coordinates 1304, origin identifier 1306, destination identifier 1308, miscellaneous descriptors 1308, flight object identifiers 1310A-n, vehicle identifier 1312, vehicle performance parameters 1314A-n, and trajectory descriptors 1316A-n acting as the four dimensional descriptor of the aircraft in space representing the X, Y and Z coordinates of the vehicle within an airspace and two different types of time, "now" time when the current computation is being carried out, and, "future" time relative to the now moment which is used to represent the current planned trajectory into the future as described in the previously identified issued patents, and an index or data references 1318A-0n to the data structures 1320A-n representing the grid tiles comprising the grid model of the area.

In accordance with the disclosure, each sub-area of the main area, e.g. a grid tile 102, has associated therewith a data object or data structure 1320A-n having associated therewith values or various data parameters including, but not limited to repulsion, attraction, proximity, summation, special descriptors, and/or data parameters. As illustrated in FIG. 133, each of data structures 1320A-n may comprise a grid tile identifier 1324, a flight object identifier 1326, a repulsion signals value 1328, an attraction signal value 1330, a proximity value 1332, a grid the summation value 1334, and one or more additional fields 1336 which may be used for special descriptors and/or additional data parameters. Depending on the status of the flight object identifier 1326, the various other parameters within the data structure 1320 will be modified accordingly in accordance with the process described herein.

Within the grid 100, the vehicle whose path is being computed, referred to herein as the "Primary Aircraft", occupies a single grid the 102. Other obstacles like weather, closed airspace, etc., may take up one or more grid tiles within grid 100. In this manner, grid tiles have a purpose in any given moment, with the grid the size or shape chosen for optimal computational efficiency.

In accordance with the disclosure, flight objects, e.g. aircraft, obstacles, flight paths, etc., not only occupy their displacement on grid 100 in 4D space-time, but they also propagate their presence throughout the monitored area to individual sub-areas, i.e. to other tiles 102 within the grid 100, representing the airspace. In particular, other aircraft and obstacles propagate a 'repulsion' signal throughout the grid. Such repulsion signals is implemented algorithmically to simulate physical characteristics such as the strength of the signal changing, e.g. dissipating or increasing as the distance from the source of the repulsion, i.e. the flight object, increases. For example, a repulsion signal may be modeled to be analogous to gravity in physics, such that the propagated signal falls off or attenuates in signal strength, i.e. value, over distance through the monitored area representing the airspace. In the illustrative embodiment, the grid tiles closest to a grid tile occupied by an obstacle, aircraft, or flight path, i.e. the source of the repulsion signals, have the strongest repulsion signal values propagated therethrough, with grid tiles which are further away having progressively weaker repulsion signal values propagated therethrough. Such propagation of a signal may be implemented by modifying the value of a parameter within the data structure associated with a specific grid tile. In the illustrative embodiment, the grid tile summation value 1334 associated with each grid tile within the grid is incremented based on the strength of the repulsion signal propagated therethrough from the flight object that is the source of the repulsion signal, with closer grid tiles being incremented with a greater magnitude than those grid tiles which are further away from the repulsion signal source.

In a similar manner, the "Primary Aircraft", propagates an attraction signal through adjacent grid tiles. Like the repulsion signal, the attraction signal may simulate physical characteristics, the propagated signals fall off or attenuate in signal strength over distance through the airspace, i.e. value, over distance through the monitored area representing the airspace. In the illustrative embodiment, the grid files closest to a grid the occupied by the Primary Aircraft, i.e. the source of the attraction signals, have the strongest attraction signal values propagated therethrough, with grid tiles which are further away having progressively weaker attraction signal values propagated therethrough. Such propagation of a signal may be implemented by modifying the value of a parameter within the data structure associated with a specific grid tile. In the illustrative embodiment, the grid tile summation value 1334 associated with each grid tile within the grid is incremented based on the strength of the attraction signal propagated therethrough from the Primary Aircraft that is the source of the repulsion signal, with closer grid tiles being incremented with a greater magnitude than those grid tiles which are further away from the repulsion signal source. In accordance with embodiments, the repulsion signal from each obstacle is iteratively used to modify the summation value of each grid tile 102 within grid 100. Thereafter, the attraction signal from the Primary Aircraft is similarly iteratively used to modify the summation value of each grid the 102 within grid 100.

Figure 2:
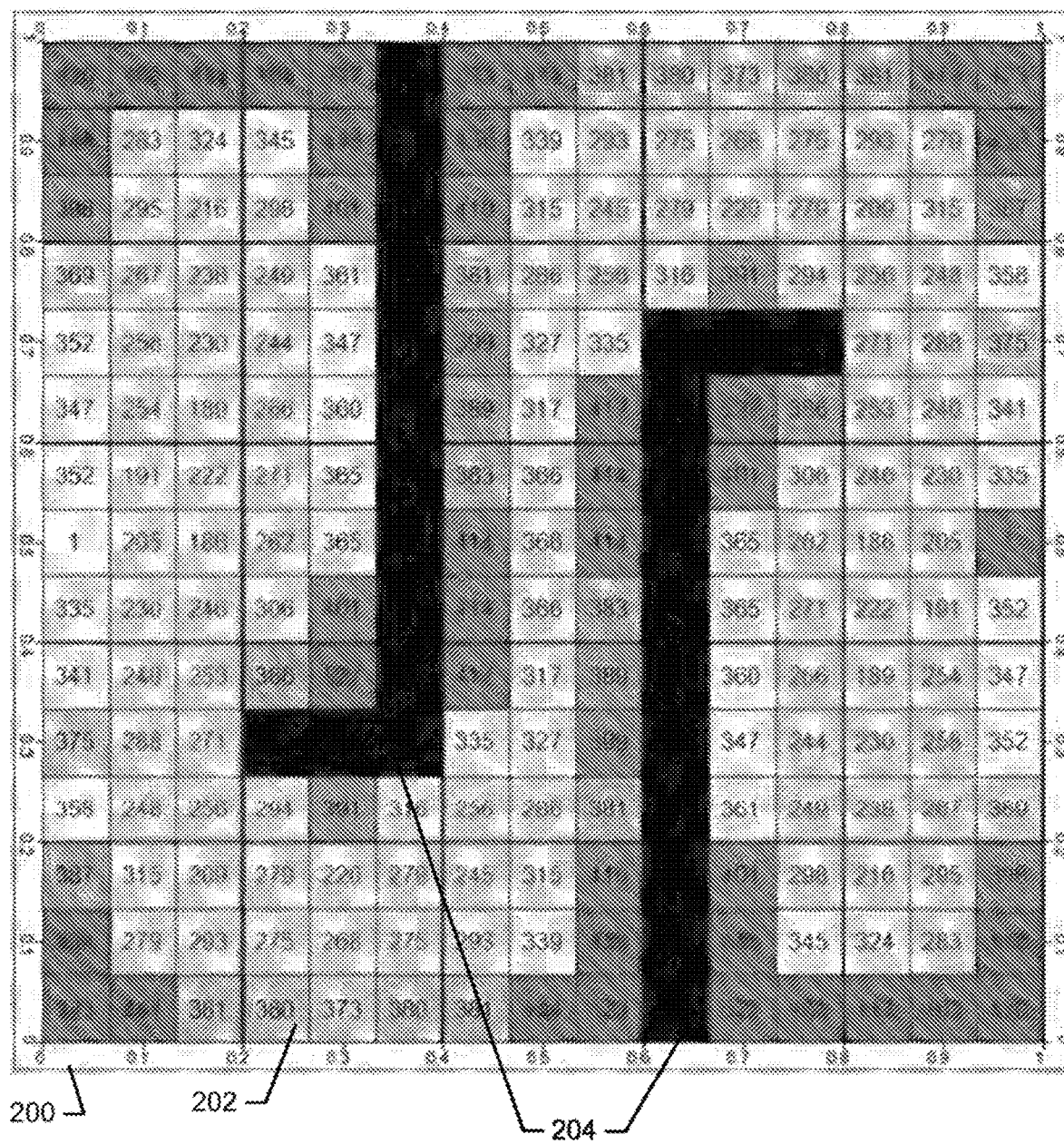
FIG. 2 illustrates conceptually a grid similar to that of FIG. 1 with magnitude of sum of repulsion signals in each tile in accordance with the disclosure.

FIG. 2 illustrates conceptually a grid 200 with fewer grid tiles 202, than that illustrated in FIG. 1, and in which the individual grid tiles are labeled with a numeric value of the summation magnitude associated with each grid tile following propagation of the repulsion signals and attraction signal. In the color scheme of FIG. 2, high numbers are 'hot' (red), while low numbers are 'cold' (green, blue). Obstacles can be thought of as 'hot' or 'high' and the Primary Aircraft flight path as 'cold' or 'low'. The net effect of all of the flight objects propagating their signals through the grid tiles comprising the airspace is that the best path for the Primary Aircraft flies through the coldest, lowest area or 'canyon' away from the hot obstacles and towards its cold flight path to the extent possible.

Figure 3:
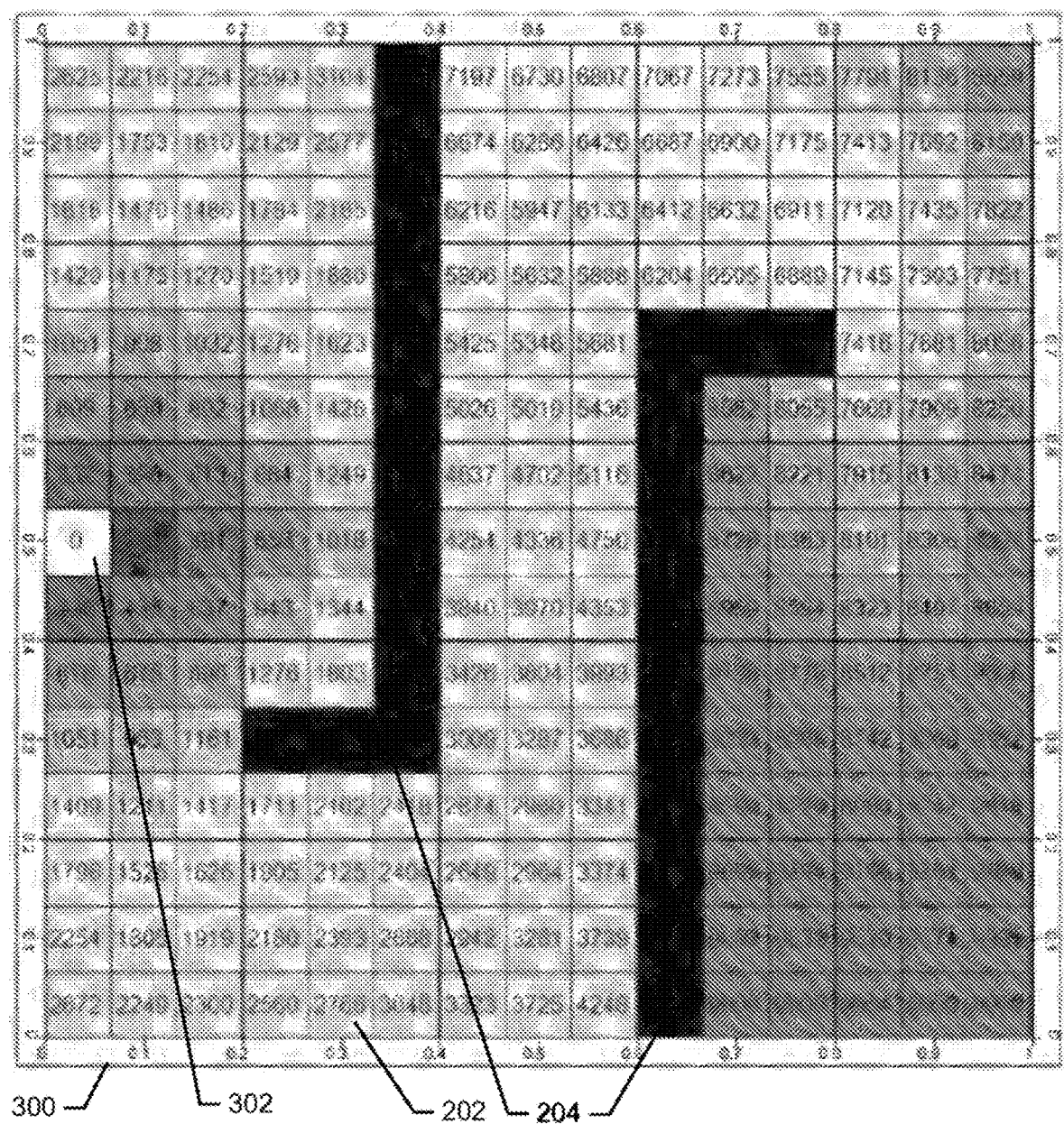
FIG. 3 illustrates conceptually the grid of FIG. 2 with magnitude of sum of values in each tile and showing the shortest 'distance' from the origin in accordance with the disclosure.

As illustrated in FIG. 2, the canyon bottom is far from monotonic in color. It may be the lowest path between the obstacles 204, e.g. walls, but it still can have various ups and downs that create difficulty identifying the optimal path, i.e. the bottom of the canyon. In order to further identify the safest and most efficient path among a plurality of stationery and/or moving obstacles, in addition to the 'heat' values illustrated in FIG. 2, the disclosed technique further contemplates the addition of another value to the summation value 1334 of each grid tile 202, which value represents the shortest 'distance' to the vehicle origin on the grid from each grid tile, where "shortest" represents the smallest sum of the heat values to get there. This method essentially floods the grid, beginning from the grid tile 302 representing the origin location of the primary craft within the grid, e.g., middle tile on the left side of FIG. 3, and propagates distance "signals" or values throughout all grid tiles 202. FIG. 3 illustrates conceptually a grid 300 that results from the flooding the grid tiles 202 outward from the origin 302, summing up the repulsion quantities, and favoring the smallest sum, i.e. shortest 'distance' (in these terms) from the origin.

Figure 4:
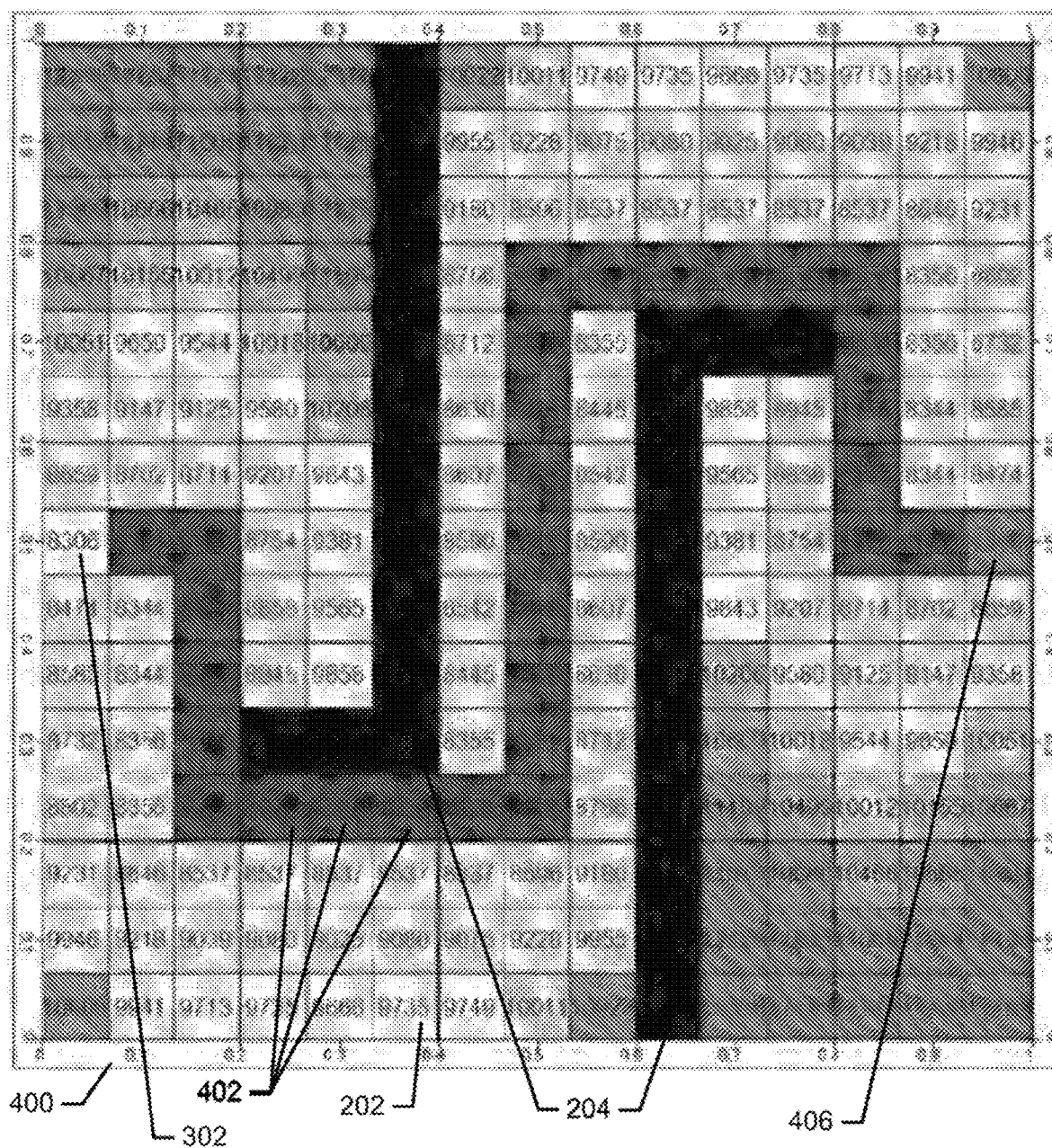
FIG. 4 illustrates conceptually the grid of FIG. 3 with magnitude of sum of values in each tile and showing the shortest 'distances' to the origin and destination with the best flight path illustrated in blue in accordance with the disclosure.
Figure 5:
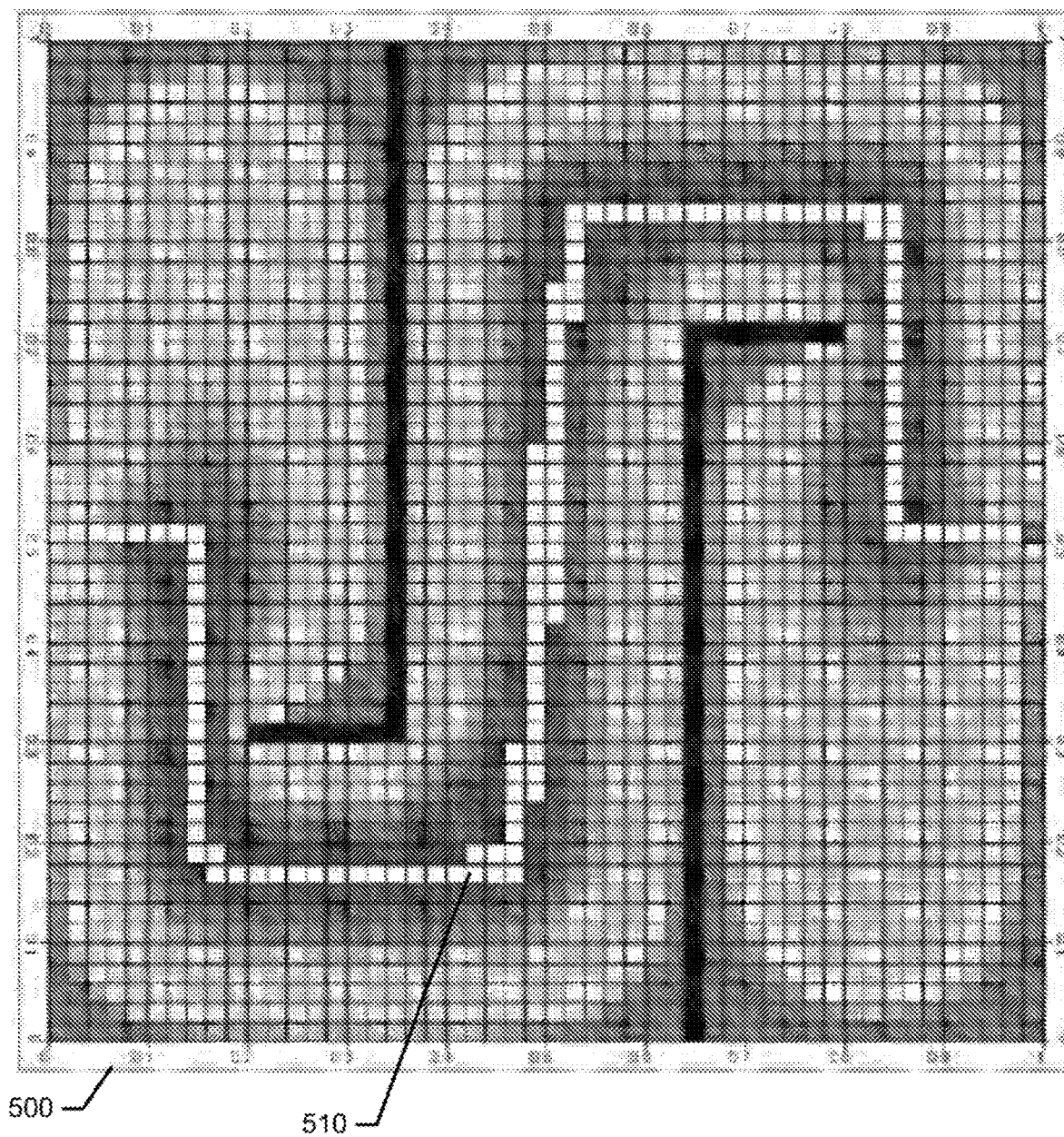
FIG. 5 illustrates conceptually the grid similar to that of FIG. 1 with the best flight path illustrated in white tiles superimposed over the 'canyon' blue in accordance with the disclosure.

Next, the disclosed technique further contemplates the addition of another value to the summation value 1334 of each grid tile 202, which value represents the shortest 'distance' to the vehicle destination on the grid from each grid tile, where "shortest" represents the smallest sum of the heat values to get there. This method essentially floods the grid, beginning from the grid tile 406 representing the destination location of the Primary Aircraft within the grid 400, e.g., middle tile on the right side of FIG. 4, and propagates distance "signals" or values throughout all grid tiles 202. FIG. 4 illustrates conceptually a grid 400 that results from the flooding the grid tiles 202 outward from the destination 406, summing up the repulsion quantities, and attraction quantities and favoring the smallest sum, i.e. shortest 'distance' (in these terms) from the destination. This operation floods the grid, beginning from the destination, e.g., middle the on the right side of FIG. 4, generating shortest 'distance' values from the destination. When the two shortest distances from the Primary Aircraft origin and vehicle destination are summed, the resulting color map grid is illustrated in FIG. 4. The 'canyon' or safest most efficient path is now a series of adjacent grid tiles 402 having identical summation values 1334, here all 8306, representing the safest most efficient path, and, therefore bottom of the canyon, is readily identifiable. Once the bottom of the canyon is computed a path or trajectory therethrough is clearly identifiable as illustrated by the way line 502 in grid 500 FIG. 5, which is illustrated with a larger number of grid tiles since the individual value of each grid tile is over no longer necessary.

Figure 6:
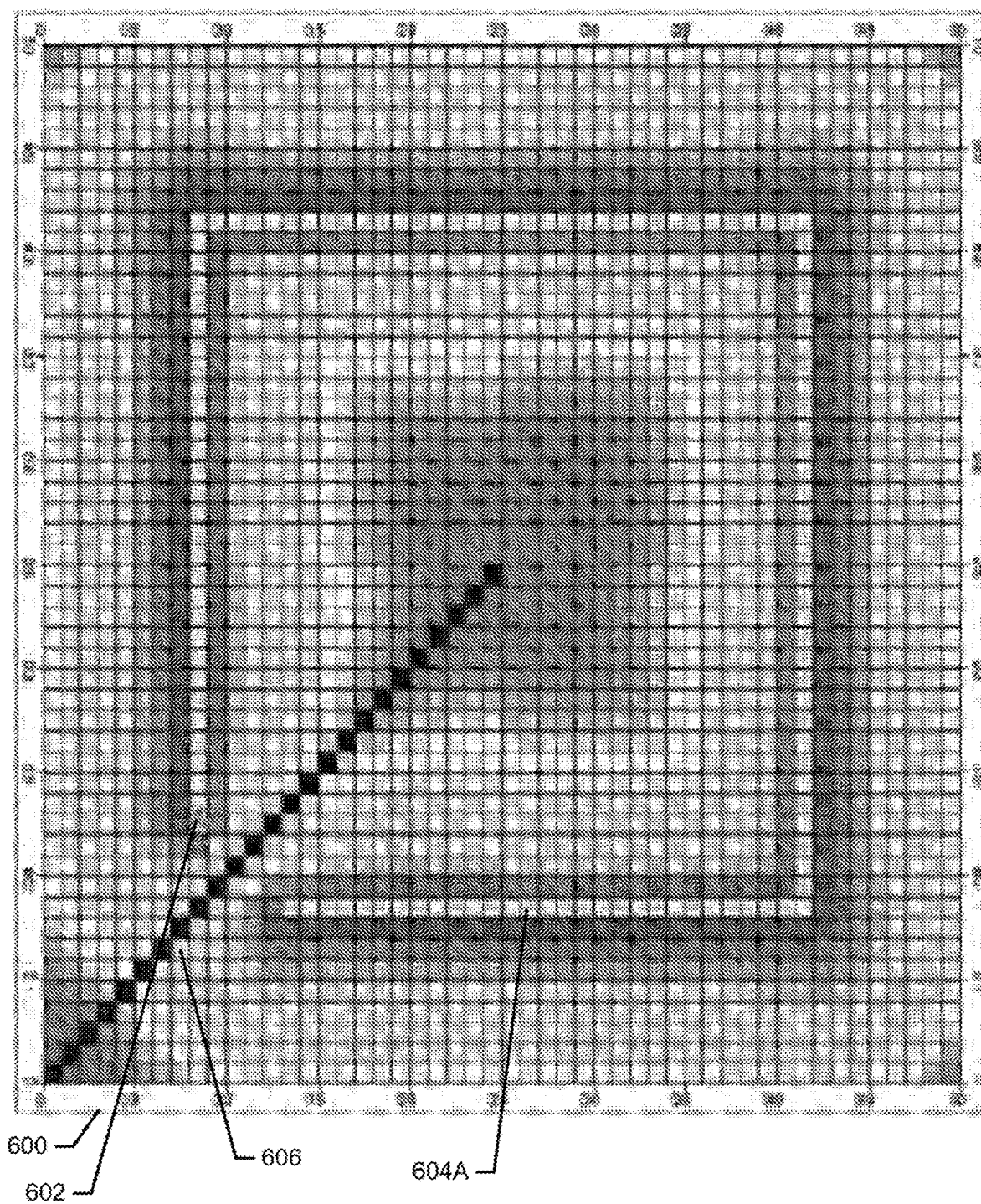
FIG. 6 illustrates conceptually a grid with shortest flight path over a grid area defined by origin, three intermediate waypoints, and a destination in accordance with the disclosure.

Referring to FIGS. 6-11, intermediate waypoints, between a vehicles origin and destination, may be defined within the vehicle trajectory by generating a path line, or great circles in an earth coordinate system, between the waypoints, including the origin and destination as 'honorary' way points. Attraction signals are then propagated outward from these path lines, as shown in FIG. 6 which illustrates the shortest flight path defined by the origin, three intermediate waypoints, and the destination.

Figure 7:
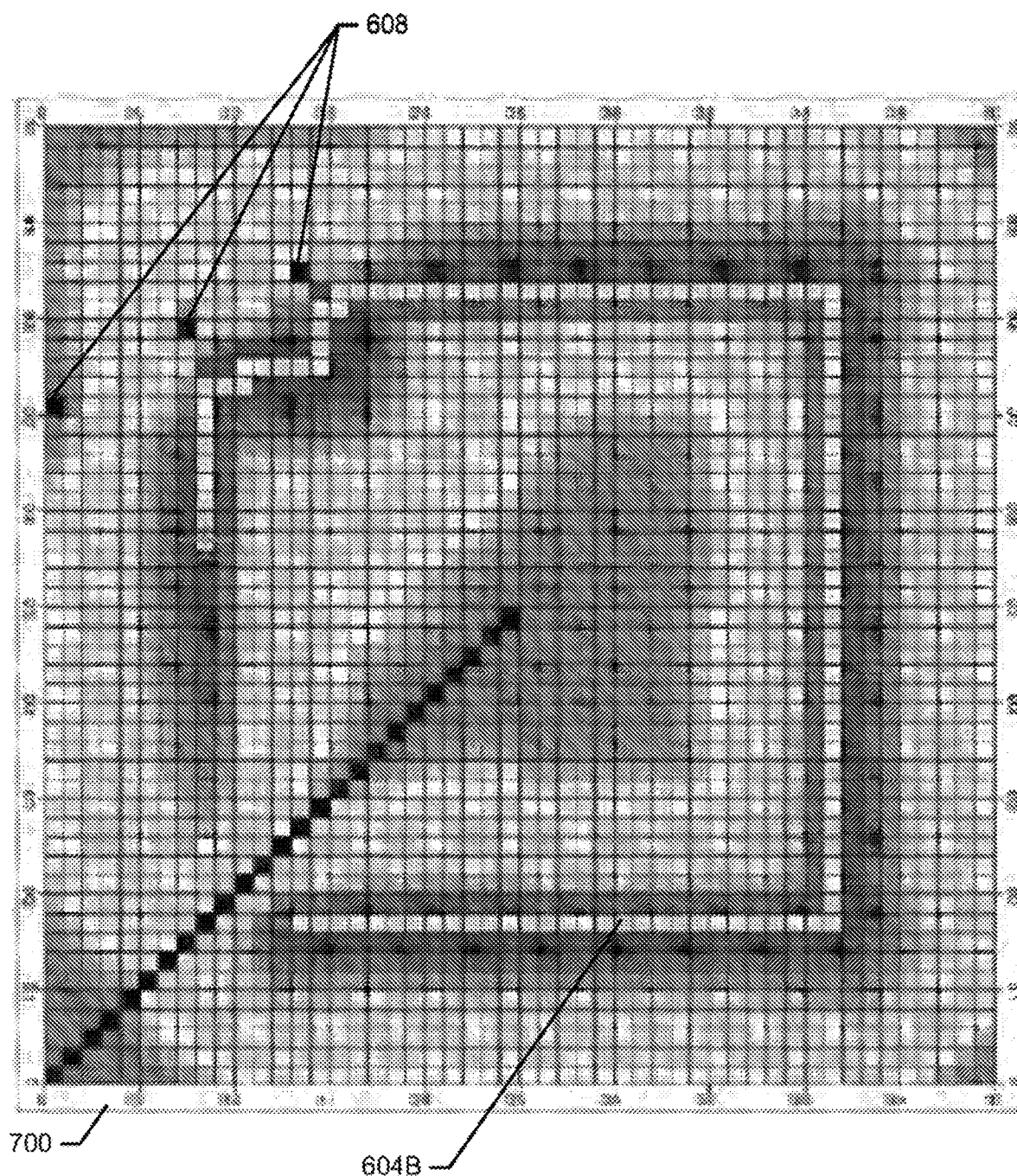
FIG. 7 illustrates conceptually the grid of FIG. 6 with a new dynamically re-computed flight plan to avoid moving obstacles in accordance with the disclosure.

The method described herein is also capable of computing and locating the safest and most efficient flight path dynamically in real-time or near real-time in which obstacles such as weather fronts and or other aircraft move dynamically throughout the airspace represented by the grid. When other aircraft, which may be represented similar to momentarily fixed obstacles, i.e. black tiles on the grid, obstruct the pre-defined flight path of a vehicle, the disclosed system responds immediately finding a new flight path which is near the original flight path, due to its attraction, but also maintains safe separation from the other 'intruding' aircraft. The method of dynamically re-computing a new flight plan in the face of new or moving obstacles is similar to that described herein with reference to FIGS. 1-6 and the flowchart of FIG. 14. FIG. 7 illustrates the results of dynamically re-computing a new flight plan in the face of new or moving obstacles.

Figure 8:
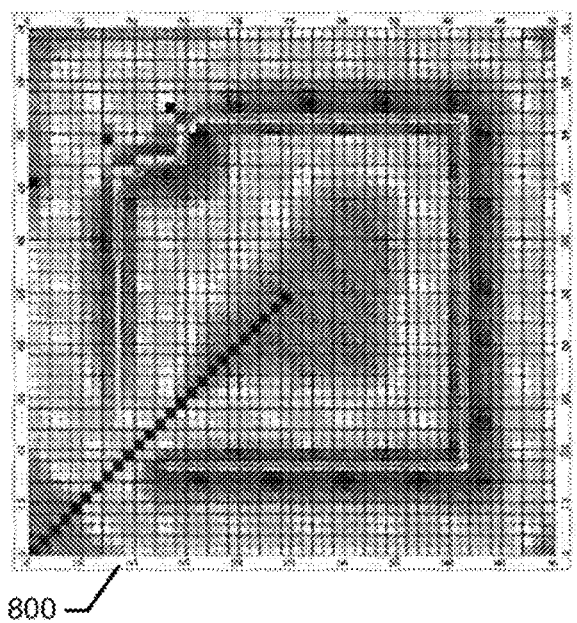
FIG. 8 illustrates conceptually the grid of FIG. 7 with the re-computed flight plan fitted with a set of cubic splines overlaid in purple in accordance with the disclosure.
Figure 9:
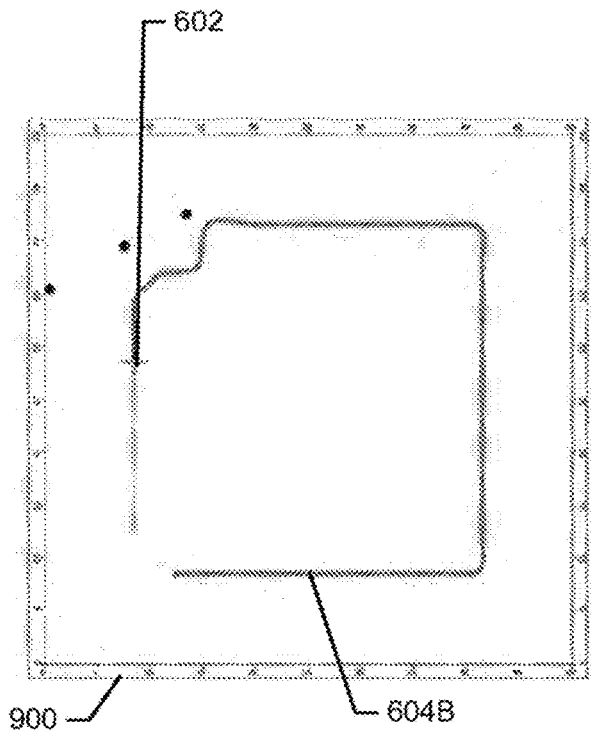
FIG. 9 illustrates conceptually, the grid of FIG. 8, without the grid tile graphics, with the re-computed flight plan overlaid in purple and further illustrating how the dynamically generated, recomputed flight path avoids the set of moving obstacles, i.e. the black dots, and leaving its history behind, as illustrated in blue, in accordance with the disclosure.

The next step in the disclosed technique is to fit a set of cubic Bezier splines to the identified flight path, within the physical limitations of flying aircraft, e.g. turn radius limits, etc. FIG. 8 illustrates conceptually the recomputed new flight plan, similar to FIG. 7, but with the new flight plan fitted with a set of cubic splines overlaid in purple. FIG. 9 illustrates conceptually, without the grid tile graphics, how the dynamically generated, recomputed flight path avoids the three other aircraft, i.e. the black dots, and leaving its history behind, as illustrated in blue.

As the obstacle aircraft move again into the flight path of our aircraft, another dynamically generated flight path is recomputed, as illustrated in FIGS. 10A-B. In this instance, the sequence of three obstacle aircraft have changed direction and cross the planned flight path of hypothetical our aircraft, causing the flight path to be recomputed to avoid the second and third of the sequence of obstacle aircraft. Similar to FIG. 8, FIG. 10 illustrates conceptually the recomputed new flight plan fitted with a set of cubic splines overlaid in purple. FIG. 11 illustrates conceptually, without the grid tile graphics, how the dynamically generated, recomputed flight path avoids the three other aircraft, i.e. the black dots, and leaving its history behind, as illustrated in blue.

Figure 14:
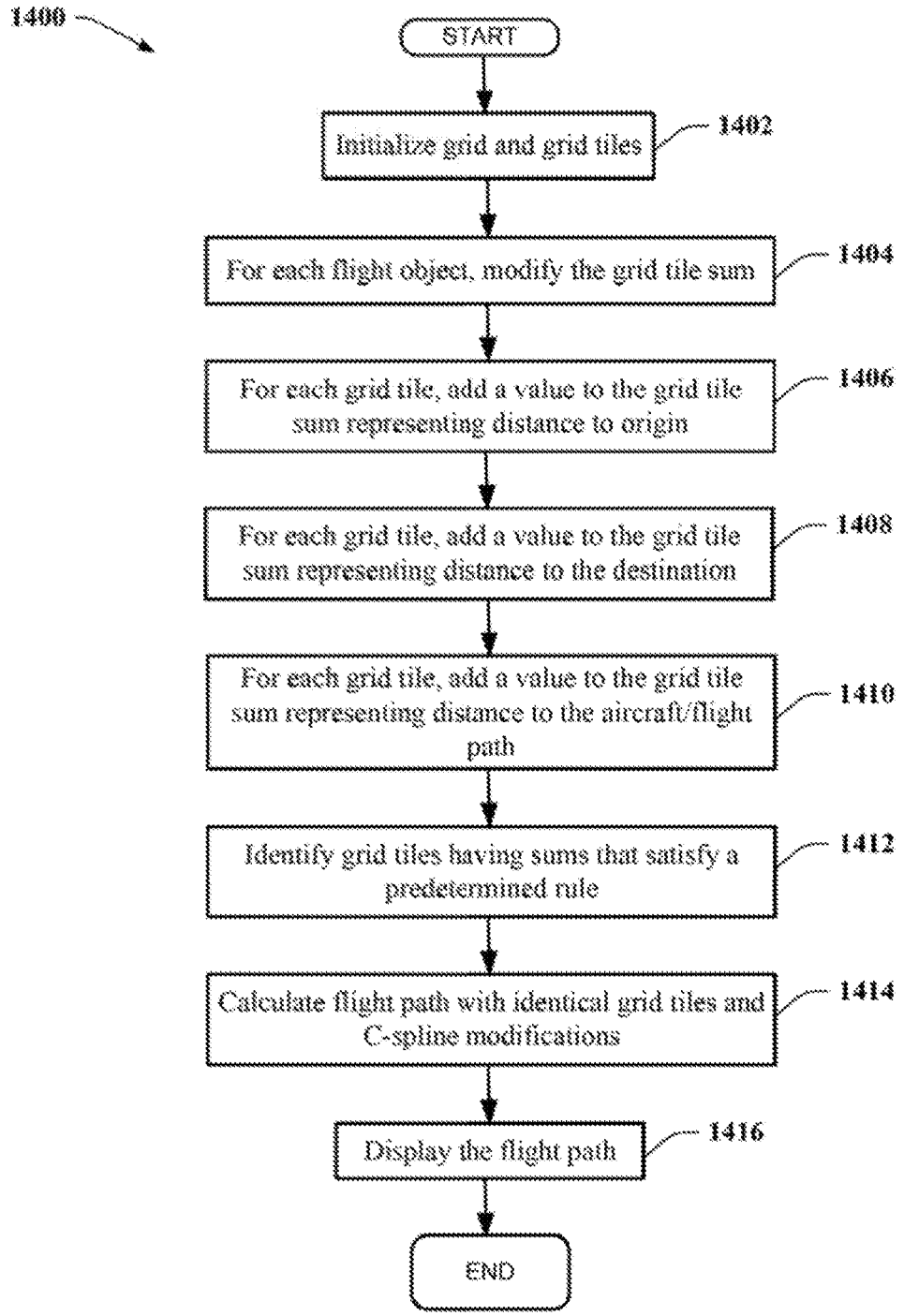
FIG. 14 illustrates conceptually a flow diagrams of algorithmic process in accordance with the disclosure.

Referring now to FIG. 14, a flowchart 1400 illustrating the algorithmic processes utilized to perform the foregoing techniques described with reference to FIGS. 1-11 is illustrated. First, a model of the area to be traversed by the vehicle is set up and initiated in memory by populating the various parameters within the data structure 1300 for the grid and initiating the various parameters for each of the data structures 1320 associated with individual subareas or grid tiles, as illustrated by process block 1402. For data structures 1320A-n such initialization process may comprise assigning values for the grid identifier 1302, geographic reference coordinates 1304, origin identifier 1306, destination identifier 1308, miscellaneous descriptors 1308, as applicable, flight object identifiers 1310A-n, vehicle identifier 1312, vehicle performance parameters 1314A-n, etc. For data structures 1320A-n such initialization process may comprise assigning values for the grid tile identifier 1324, identifying if the particular grid the associated with a flight object, e.g. an obstacle, by initiating the a flight object identifier 1326, and initiating the grid the summation value 1334, to a starting value.

For each grid tile 202A-n within a grid 100, a repulsion signal value representing the distance from the flight object, e.g. an obstacle, to the grid the is added to the summation value 1334 of data structure 1320 associated with each grid tile, as illustrated by process step 1404. Such process may be done iteratively for each grid the within the grid area for each flight object identified within the grid. For example, if five different grid tiles have obstacles associated therewith, the summation value for other grid tiles within the grid that do not have any of the fives obstacles located therein will be modified five times, one for each obstacle. Next, the distance value from the origin of the Primary Aircraft is added to the summarization value associated with each grid tile, as described herein, and as illustrated by process block 1406. Next, a distance value from the destination of the Primary Aircraft is added to the summarization value associated with each grid tile, as described herein, and as illustrated by process block 1408. Next, an attraction signal which emanates from the Primary Aircraft and dissipates with the distance therefrom, or in the case of recalculation of an existing flight path, from any tiles in the previously calculated flight path, is added to the summation value associated with each grid tile, as illustrated by process step 1410. Again, such process is done iteratively for each grid tile within the grid area. Finally, the grid tiles are compared to predetermined rule, e.g. those grid tiles having the lowest summarization values, and those grid tiles satisfying the rule are identified as the optimal path for the Primary Aircraft, as illustrated by process block 1412. Finally, a flight path is calculated for the Primary Aircraft from the adjacent grid tiles extending contiguously from the origin to the destination, as identified by process block 1412, and is further modified with one or more cubic splines to eliminate sharp angle variations in the optimal flight path, as illustrated by process block 1414. The process flow represented by the process blocks 1402 through 1414 may be repeated as necessary based on any number of conditions, including preplanned frequency, appearance of new obstacles, changes in direction, heading, altitude, etc. Optionally, the data representing the grid 500 with the calculated flight path 510 of the Primary Aircraft super imposed thereon, similar to that illustrated in FIG. 5, may be displayed, as Illustrated by process 1416. Alternatively, the flight path without the grid graphics, similar to that illustrated in FIGS. 9 and 11, may be displayed.

The activities described with reference to process blocks 1404, 1406, 1408 and 1410 may be done in an iterative loop manner. In one implementation, each grid tile within the grid may be updated relative to each plate object, e.g. other obstacles, whether patterns, other aircraft or vehicles, etc. Thereafter each grid tile within the grid may be also iteratively updated sequentially for each of the relative attraction signal emanated by the Primary Aircraft, the grid tile distance from the Primary Aircraft origin, and the grid tile distance from the primary aircraft destination. Thereafter, the values of the summation value 1334 of data structure 320 associated with each of the grid tiles may be compared against a predetermined rule, e.g. values having magnitudes within a certain range, or any grid having identical values, or grids having the lowest values, etc., to identify those grids possibly defining the safest, shortest path through the area represented by the grid between the origin and destination of the Primary Aircraft.

Alternatively, the activities described with reference to process blocks 1404, 1406, 1408 and 1410 of the above-described algorithmic processes may be done in an iterative loop manner one grid tile at a time. In this manner, the summation value 1334 associated with each grid tile will be updated relative to each of the flight objects within the grid space, the attraction signal from the Primary Aircraft, if any, and the grid tile relative distance from the origin of the Primary Aircraft and the destination of the Primary Aircraft. The tiles may be updated in a specific order, e.g. from lowest to highest identifiers, directionally, from origin to destination, or by proximity to the Primary Aircraft, e.g., those grid tiles closest to the current location of the tile representing the Primary Aircraft being updated first upon initiation of the path calculation or at recalculation intervals.

At any point in the process described with reference to FIG. 14 and elsewhere herein, a grid heat map may be visually rendered to a display apparatus, similar to those illustrated in FIGS. 1-8 and 10. In such grid heat maps, the summation value of each individual grid the may be mapped to a corresponding color or pattern which provides a visual queue as to the magnitude of the summation value associated therewith and, therefore, the suitability of the grid the to be included as part of the path of the Primary Vehicle. Such grid heat maps may likewise be re-rendered upon the same or different events as the recalculation of the vehicle path.

Any number of events may be used to trigger recalculation of the flight path of the Primary Aircraft during its travel between the origin and destination, including, but not limited to predetermined interval as may be implemented with an interrupt timer, appearance of new obstacles, changes in direction, heading, altitude, etc., or other preplanned or real-time data events, as available.

System Platform and Network Environment

Figure 12:
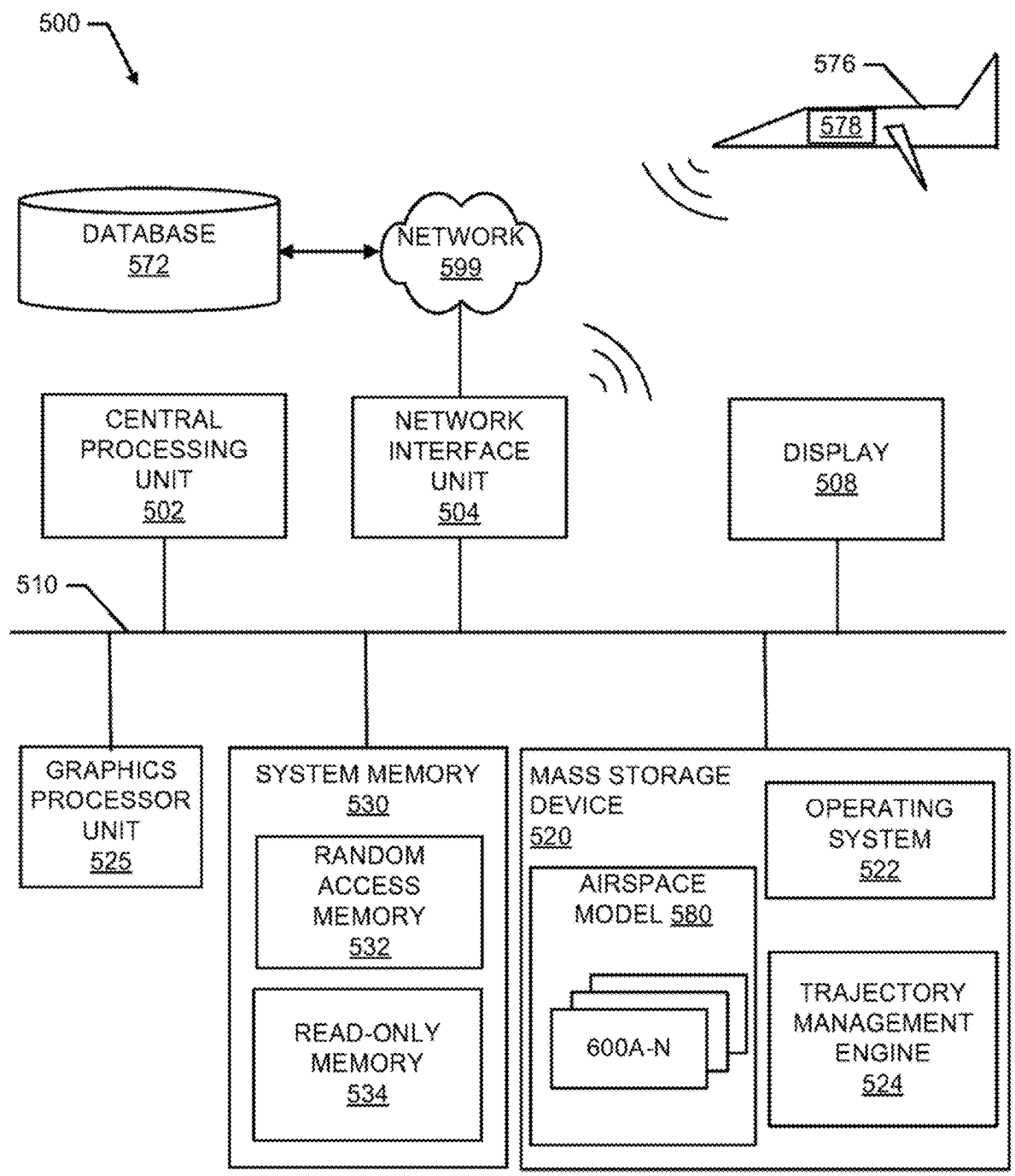
FIG. 12 illustrates conceptually a block diagram of an illustrative architecture of a processing system and network environment for calculating and recalculating aircraft trajectories in accordance with the disclosure.

FIG. 12 illustrates conceptually a block diagram of an illustrative architecture of a processing system and network environment for calculating and recalculating aircraft trajectories or paths in accordance with systems and techniques disclosed herein. System 500 may comprise a central processing unit 502 (CPU), a system memory 530, including a random access memory 532 (RAM) and a read-only memory 534 (ROM), and a system bus 510 that can couple the system memory 530 to the CPU 502. An input/output system containing the basic routines that help to transfer information between elements within the computer architecture 500, such as during startup, can be stored in the ROM 534. The computer architecture 500 may further include a mass storage device 520 for storing an operating system 522, software, data, and various program modules, such as the trajectory management engine 524.

The mass storage device 520 can be connected to the CPU 502 through a mass storage controller (not illustrated) connected to the bus 510. The mass storage device 520 and its associated computer-readable media can provide non-volatile storage for the computer architecture 500. Although the description of computer-readable media contained herein refers to a mass storage device, such as a hard disk or CD-ROM drive, it should be appreciated by those skilled in the art that computer-readable media can be any available computer storage media that can be accessed by the computer architecture 500.

By way of example, and not limitation, computer-readable media may include volatile and non-volatile, removable and non-removable media implemented in any method or technology for the non-transitory storage of information such as computer-readable instructions, data structures, program modules or other data. For example, computer-readable media includes, but is not limited to, RAM, ROM, EPROM, EEPROM, flash memory or other solid state memory technology, CD-ROM, digital versatile disks (DVD), HD DVD, BLU RAY, or other optical storage, magnetic cassettes, magnetic tape, magnetic disk storage or other magnetic storage devices, or any other medium which can be used to store the desired information and which can be accessed by the computer architecture 500.

According to various embodiments, the computer architecture 500 may operate in a networked environment using logical connections to remote computers through a network such as the network 599. The computer architecture 500 may connect to the network 599 through a network interface unit 504 connected to the bus 510. It should be appreciated that the network interface unit 504 may also be utilized to connect to other types of networks and remote computer systems, such as a computer system on board an aircraft 576. The computer architecture 500 may also include an input/output controller for receiving and processing input from a number of other devices, including a keyboard, mouse, or electronic stylus (not illustrated). Similarly, an input/output controller may provide output to a video display 506, a printer, or other type of output device. A graphics processor unit 525 may also be connected to the bus 510.

A number of program modules and data files may be stored in the mass storage device 520 and RAM 532 of the computer architecture 500, including an operating system 522 suitable for controlling the operation of a networked desktop, laptop, server computer, avionics display or other computing platform. The mass storage device 520, ROM 534, and RAM 532 may also store one or more of the program modules 600A-N as well as an airspace mod& 580. The airspace model 580 may be utilized in the setting up and initializing of the data structures 1313 20 associated with the grid and its respective constituent grid tiles, in accordance with the disclosure. In particular, the mass storage device 520, the ROM 534, and the RAM 532 may store the trajectory management engine 524 for execution by the CPU 502. The trajectory management engine 524 can include software components for implementing portions of the processes discussed in detail with respect to the Figure and elsewhere herein. The mass storage device 520, the ROM 534, and the RAM 532 may also store other types of program modules.

Software modules, such as the various modules within the trajectory management engine 524 may be associated with the system memory 530, the mass storage device 520, or otherwise. According to other embodiments, the trajectory management engine 524 may be stored remotely over network 599 and executed by any computer within the network 599.

The software modules may include software instructions that, when loaded into the CPU 502 and executed, transform a general-purpose computing system into a special-purpose computing system customized to facilitate all, or part of, calculation and recalculation of vehicle paths within an area or space, as disclosed herein. As detailed throughout this description, the program modules may provide various tools or techniques by which the computer architecture 500 may participate within the overall systems or operating environments using the components, logic flows, and/or data structures discussed herein.

The CPU 502 may be constructed from any number of transistors or other circuit elements, which may individually or collectively assume any number of states. More specifically, the CPU 502 may operate as a state machine or finite-state machine. Such a machine may be transformed to a second machine, or specific machine by loading executable instructions contained within the program modules. These computer-executable instructions may transform the CPU 502 by specifying how the CPU 502 transitions between states, thereby transforming the transistors or other circuit elements constituting the CPU 502 from a first machine to a second machine, wherein the second machine may be specifically configured to manage trajectories of aircraft within an airspace. The states of either machine may also be transformed by receiving input from one or more user input devices associated with the input/output controller, the network interface unit 504, other peripherals, other interfaces, or one or more users or other actors. Either machine may also transform states, or various physical characteristics of various output devices such as printers, speakers, video displays, or otherwise.

Encoding of the program modules may also transform the physical structure of the storage media. The specific transformation of physical structure may depend on various factors, in different implementations of this description. Examples of such factors may include, but are not limited to: the technology used to implement the storage media, whether the storage media are characterized as primary or secondary storage, and the like. For example, if the storage media are implemented as semiconductor-based memory, the program modules may transform the physical state of the system memory 530 when the software is encoded therein. For example, the software may transform the state of transistors, capacitors, or other discrete circuit elements constituting the system memory 530.

As another example, the storage media may be implemented using magnetic or optical technology. In such implementations, the program modules may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. It should be appreciated that various other transformations of physical media are possible without departing from the scope and spirit of the present description.

In the illustrative embodiment, the acquisition of data describing flight objects, including other obstacles, both stationary and movable, as well as the general area or space encompassed by the grid 100 may be acquired by computer system 500 through a network interface 504 from various sources such as database 572 or directly from vehicles or other entities equipped with a transmitter or transponder, such as aircraft 576 containing thereon apparatus 578, as described herein. Alternatively, the data describing flight objects may be detected by the Primary Aircraft itself utilizing microwave or other sensing technologies, both active and passive, alone or in conjunction with other sources of data.

The software algorithms utilized by the system disclosed herein may be written in a number of languages including, C #, Python, Cuda, etc. For example, the trajectory management system 524, including any associated user interface therefore may be written in C sharp. High level control of the GPU, web interface, and other functions may be written in Python.

Although the present invention has been described in detail with respect to various embodiments, it is appreciated that the present invention may have various further and/or other embodiments that fall within the spirit and scope of the appended claims. For example, although the illustrative embodiment has been described with reference to calculation recalculation of the path of an aircraft, those skilled in the arts will understand how the concepts described here in can be equally applied to either land vehicles or water vehicles without undue experimentation using the teachings contained herein.

What is claimed is:

1. A method for planning a path of a vehicle through an area, the method comprising:
    modeling, within a computer memory, a selected area of flight space as a plurality of sub-areas;
    associating a value with each of the sub-areas based on a propagation of both aircraft and obstacles through the sub-areas up to a current time and into future time;
    selecting one of the aircraft as a primary aircraft; and
    determining a flight path for the primary aircraft through the airspace based on a component of the value comprising repulsion signals associated with all aircraft other than the primary aircraft and the obstacles.

2. The method of claim 1, wherein associating the value comprises:
    summing up the repulsion signals and offsetting the sum of the repulsion signals by an attraction signal associated with the primary aircraft.

3. The method of claim 2, wherein the repulsion signals are strongest proximate to the aircraft and the obstacles with which each of the repulsion signals are associated, and wherein a strength of the repulsion signals reduces with distance from the aircraft and the obstacles with which each of the repulsion signals are associated.

4. The method of claim 3, wherein the attraction signal is strongest proximate to the primary aircraft, and wherein a strength of the attraction signal reduces with distance from the primary aircraft.

5. The method of claim 4, wherein determining the flight path comprises determining, into future time, a series of consecutive sub-areas having one of a greatest or least value and satisfying a rule relative to flight path calculation.

6. The method of claim 1, wherein determining the flight path is repeated in response to appearance of a new object.

7. The method of claim 1, wherein determining the flight path is repeated at a predetermined frequency.

8. The method of claim 1, wherein determining the flight path is repeated in response to a change in a direction, heading, or altitude of the primary aircraft.

9. The method of claim 1, wherein the obstacles include weather events.

10. The method of claim 1, further comprising displaying a grid heat map based on the value of each of the sub areas.

11. A system for planning a path of a vehicle through an area, the system comprising a processor and a memory coupled to the processor for storing data to be processed by the processor, the processor being configured to:
- model, within a computer memory, a selected area of flight space as a plurality of sub-areas;
- associate a value with each of the sub-areas based on a propagation of both aircraft and obstacles through the sub-areas up to a current time and into future time;
- select one of the aircraft as a primary aircraft; and
- determine a flight path for the primary aircraft through the airspace based on a component of the value comprising repulsion signals associated with all aircraft other than the primary aircraft and the obstacles.

12. The system of claim 11, wherein associating the value comprises:
- summing up the repulsion signals and offsetting the sum of the repulsion signals by an attraction signal associated with the primary aircraft.

13. The system of claim 12, wherein the repulsion signals are strongest proximate to the aircraft and the obstacles with which each of the repulsion signals are associated, and wherein a strength of the repulsion signals reduces with distance from the aircraft and the obstacles with which each of the repulsion signals are associated.

14. The system of claim 13, wherein the attraction signal is strongest proximate to the primary aircraft, and wherein a strength of the attraction signal reduces with distance from the primary aircraft.

15. The system of claim 14, wherein determining the flight path comprises determining, into future time, a series of consecutive sub-areas having one of a greatest or least value and satisfying a rule relative to flight path calculation.

16. The system of claim 11, wherein determining the flight path is repeated in response to appearance of a new object.

17. The system of claim 11, wherein determining the flight path is repeated at a predetermined frequency.

18. The system of claim 11, wherein determining the flight path is repeated in response to a change in a direction, heading, or altitude of the primary aircraft.

19. The system of claim 11, wherein the obstacles include weather events.

20. The system of claim 11, wherein the processor is further configured to display a grid heat map based on the value of each of the sub areas.

* * * * *